(12) United States Patent
Ooseki et al.

(10) Patent No.: US 7,501,304 B2
(45) Date of Patent: Mar. 10, 2009

(54) METHOD OF CLEANING COVER GLASS HAVING SPACER

(75) Inventors: Meiki Ooseki, Minami-Ashigara (JP); Kiyofumi Yamamoto, Minami-Ashigara (JP); Masamichi Hara, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 219 days.

(21) Appl. No.: 11/523,502

(22) Filed: Sep. 20, 2006

(65) Prior Publication Data

US 2007/0072392 A1      Mar. 29, 2007

(30) Foreign Application Priority Data

Sep. 20, 2005    (JP)    ............... 2005-272389

(51) Int. Cl.
*H01L 21/00*      (2006.01)
(52) U.S. Cl. .............. 438/57; 438/48; 438/788; 257/E21.229
(58) Field of Classification Search ............. 438/57, 438/48, 788; 257/E21.229
See application file for complete search history.

(56) References Cited

U.S. PATENT DOCUMENTS

2004/0129967 A1* 7/2004 Kim et al. ............... 257/306
2005/0062952 A1* 3/2005 Kido ........................ 355/84
2006/0014391 A1* 1/2006 Lee et al. ................ 438/695

FOREIGN PATENT DOCUMENTS

JP       7-202152 A     8/1995
JP    2002-231921 A     8/2002

* cited by examiner

*Primary Examiner*—Walter L Lindsay, Jr.
*Assistant Examiner*—Abdulfattah Mustapha
(74) *Attorney, Agent, or Firm*—Sughrue Mion, PLLC

(57)  ABSTRACT

The present invention provides a method of cleaning a cover glass having a spacer which is to be incorporated in a solid image pickup device, comprising: a dry cleaning step performed after dry etching; a wipe-off cleaning step performed after the dry cleaning step; a primary wet cleaning step performed after the wipe-off cleaning step; and a secondary wet cleaning step performed after the primary wet cleaning step, wherein the cover glass having a spacer is fabricated by a manufacturing process including the steps of: bonding a spacer substrate to a glass substrate with an adhesive; applying a photoresist to the spacer substrate; exposing and developing the photoresist by use of a photomask and forming an etching mask corresponding to the spacer on the spacer substrate; and forming a spacer on the glass substrate by the dry etching the spacer substrate.

7 Claims, 7 Drawing Sheets

FIG.4

CLEANING CONDITIONS (1) DRY CLEANING

| ASHING METHOD | BARREL TYPE |
|---|---|
| GAS TO BE USED | $O_2$ (FLOW RATE: 400sccm) |
| RF OUTPUT | 600W |

(2) WET CLEANING

| | APM CLEANING | PURE-WATER ULTRASONIC CLEANING |
|---|---|---|
| CLEANING LIQUID | APM ($NH_4OH:H_2O_2:H_2O=1:4:20$) | PURE WATER |
| ULTRASONIC WAVE FREQUENCY | 950kHz | 38kHz |
| ULTRASONIC WAVE DENSITY $W/cm^2$ | 0.3$W/cm^2$ | 0.9$W/cm^2$ |
| TEMPERATURE | 20°C~45°C | 20°C~35°C |
| CLEANING TIME | 10min | 10min |

FIG.5A

FIG.5B  $O_2$ ISOTROPIC ETCHING
(REMOVAL OF RESIST AND ADHESIVE LAYER)

FIG.5C

FIG.5D  CLEANING

FIG.8B  O₂ ASHING (REMOVAL OF RESIST AND ADHESIVE LAYER)

FIG.8C

FIG.8D  CLEANING

FIG.8E

RELATED ART

METHOD OF CLEANING COVER GLASS HAVING SPACER

BACKGROUND OF THE INVENTION

1. Field of the Invention

The present invention relates to a method of cleaning a cover glass and, more particularly, to a method of cleaning a cover glass having a spacer during the manufacture of a chip size package (CSP) type solid image pickup device.

2. Description of the Related Art

A solid image pickup device formed from a CCD or a CMOS, which is used in digital cameras and cellular phones, is required to be more and more miniaturized. For this reason, at present there is a shift from conventional large-size packages, such as a type in which the whole solid image pickup element chip is hermetically sealed in a package of ceramics and the like, to a chip size package (CSP) type having almost the same size as the size of a solid image pickup device.

Against this background, there have been proposed methods by which a spacer is formed on a transparent glass plate corresponding to a position surrounding the photo-detecting portion of each of the solid image pickup elements which are formed in a large number on a wafer (a semiconductor substrate), this transparent glass plate is bonded to the wafer in a spacer portion to form a void part between the transparent glass plate and the wafer, and after that, the transparent glass plate and the wafer are diced along scribe lines, whereby the transparent glass plate and the wafer are separated into individual solid image pickup devices (refer to Japanese Patent Application Laid-Open No. 7-202152 and Japanese Patent Application Laid-Open No. 2002-231921, for example).

Figure 7A:
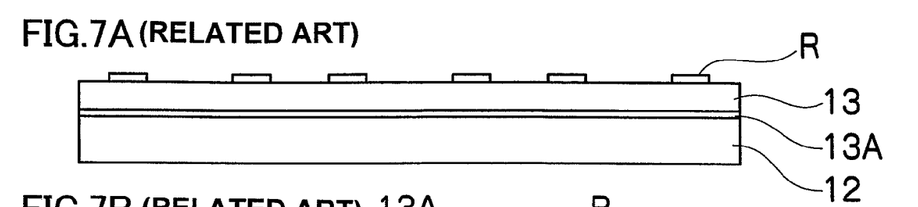
FIGS. 7A to 7C are sectional views of the step of forming a spacer.
Figure 7B:
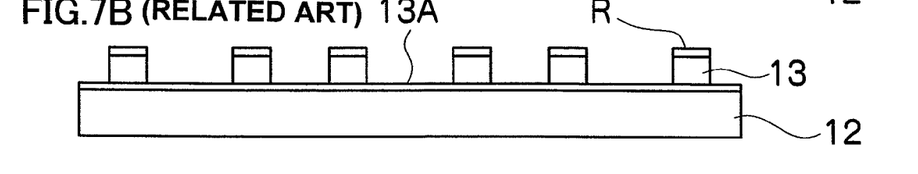
Figure 7C:
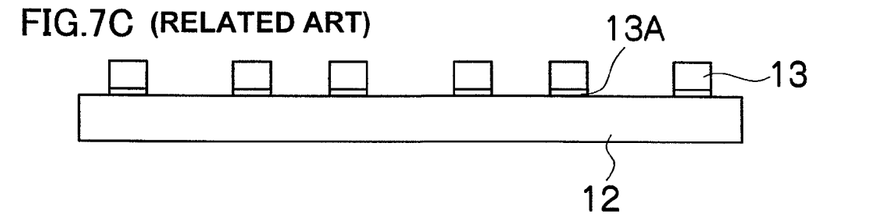

It is general practice to adopt dry etching as a method of forming a spacer on such a transparent glass plate as described above. FIGS. 7A to 7C are sectional views of a step of forming this spacer. In FIG. 7A, a spacer substrate which becomes a spacer 13 is bonded to a surface of a cover glass 12, which corresponds to a transparent glass plate, via an adhesive 13A. Subsequently, a pattern of a photoresist R as an etching mask is formed on a surface of this spacer substrate.

For example, a silicon wafer can be used as the spacer substrate which becomes the spacer 13. The pattern of the photoresist R is formed by going through the steps of exposure using a resist coat and a photomask, development, post bake and the like.

Subsequently, in FIG. 7B, the anisotropic etching of the spacer substrate (the silicon wafer) which becomes the spacer 13 is performed by dry etching and a pattern of the spacer is formed. On this occasion, the adhesive 13A, which has etching resistance, is not removed.

Subsequently, in FIG. 7C, ashing is performed and the pattern of the photoresist R and the exposed adhesive 13A are removed. In this manner, the pattern of the space 13 is formed on the surface of the cover glass 12.

SUMMARY OF THE INVENTION

However, in this method of forming a spacer, there is a high possibility that the following irregularities (Defect 1 to Defect 3) occur.

Insufficient cleanliness can be mentioned as Defect 1. In the cover glass 12 on the surface of which the pattern of the spacer 13 is formed, it is necessary to remove all foreign substances of not less than 5 μm having an effect on an image to be picked up. In the above-described treatment method, however, dry etching residues, foreign substances ascribable to the environment and the like cannot be thoroughly removed, and a cover glass of a solid image pickup device becomes apt to have insufficient cleanliness.

Adhesive marks can be mentioned as Defect 2. FIGS. 8A to 8E are flowcharts to explain the mechanism of producing such irregularities. FIGS. 8A to 8E are partial sectional views which show an enlarged part of each sold image pickup element chip of the cover glass 12 shown in FIGS. 7A to 7C.

Figure 8A:
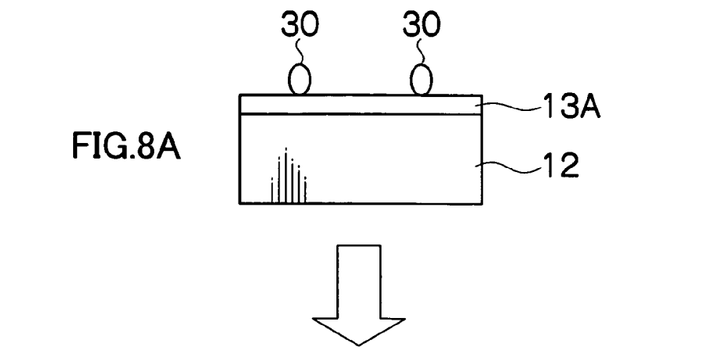
FIGS. 8A to 8E are flowcharts to explain the mechanism of producing irregularities in the formation of a spacer.

FIG. 8A is an enlarged view of a part where the pattern of the spacer 13 is not formed in FIG. 7B. In FIG. 8A, what is present on the surface of the layer of the adhesive 13A is foreign substances 30, 30, such as particles.

Figure 8B:
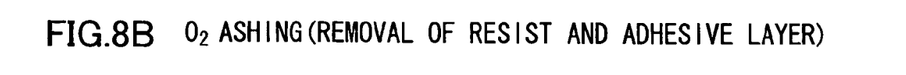

In FIG. 8B, ashing (oxygen plasma ashing) is performed to remove the pattern of the photoresist R (refer to FIG. 7B) and the layer of the adhesive 13A. In this ashing, anisotropic ashing is performed in order to prevent the horizontal corrosion of the adhesive 13A by oxygen plasma.

Figure 8C:
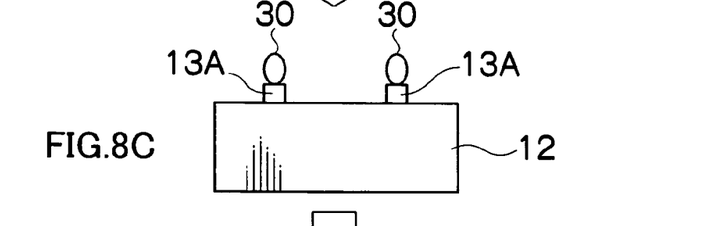
Figure 8D:
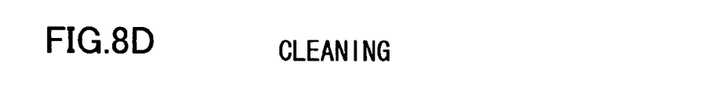
Figure 8E:
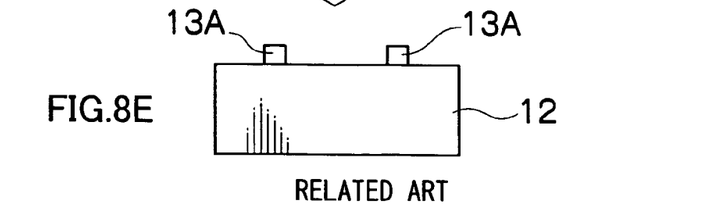

However, as shown in FIG. 8C, if there are foreign substances 30, 30 such as particles, the foreign substances 30, 30 function as a mask during ashing and the removal of the adhesive 13A in this part becomes insufficient.

And even after going through cleaning, which is the next step, the remaining adhesive 13A remain as adhesive marks. Because the adhesive marks substantially lower the quality of a solid image pickup device, it is necessary to remove them. However, it is difficult to remove adhesive marks later by a general cleaning method, thereby posing a big problem.

The exfoliation of the spacer 13 can be mentioned as Defect 3. The dry etching residues, foreign substances ascribable to the environment and the like in Defect 1 described above are organic substances. If a conventional general wet cleaning which works on organic substances, for example, cleaning with an SPM liquid (a liquid having an $H_2SO_4$:$H_2O_2$ ratio of 4:1) is performed, the action of the chemical liquid causes damage to the adhesive of the spacer formed from organic substances and the exfoliation of the spacer 13 is apt to occur.

The present invention has been made in view of the above circumstances, and in the cleaning of a cover glass of a solid image pickup device which is constituted by a solid image pickup element chip (a wafer) and the cover glass, the invention has as its object the provision of a method of cleaning a cover glass which eliminates each of the above-described defects, has high cleaning performance and reduces cost.

To achieve the above-described object, the present invention provides a method of cleaning a cover glass having a spacer which is to be incorporated in a solid image pickup device, the cover glass having a spacer being fabricated by a manufacturing process including: a step of bonding a spacer substrate to a glass substrate with an adhesive, a step of applying a photoresist to the spacer substrate, a step of exposing and developing the photoresist by use of a photomask and forming an etching mask corresponding to the spacer on the spacer substrate, and a step of forming a spacer on the glass substrate by dry etching the spacer substrate. In this manufacturing process, the cover glass having a spacer after the dry etching is cleaned by a dry cleaning step performed after the dry etching, a wipe-off cleaning step performed after the dry cleaning step, a primary wet cleaning step performed after the wipe-off cleaning step, and a secondary wet cleaning step performed after the primary wet cleaning step.

In the present invention, the dry cleaning step is a step in which an etching mask on the spacer after the dry etching and an adhesive exposed to the glass substrate are removed by performing ashing by an oxygen plasma, the wipe-off cleaning step is a step in which foreign substances adhering to an outer surface side of the cover glass having a spacer where no spacer is formed is removed by being wiped off by use of an organic solvent, the primary wet cleaning step is a step of APM cleaning in which dry etching residues and environmental foreign substances which cannot be removed by the ashing by an oxygen plasma are caused to float up from the glass substrate by use of an APM cleaning liquid, and the secondary wet cleaning step is a step of removing foreign substances by pure-water ultrasonic cleaning.

According to the present invention, high cleaning performance is obtained because the wipe-off step with an organic solvent after ashing and the wet cleaning step which follows the wipe-off step are provided. Particularly, because an APM cleaning liquid is used, a zeta potential on the glass surface takes a large negative value and, therefore, the re-adhering of foreign substances seldom occurs.

In the present invention, it is preferred that the ashing by an oxygen plasma be isotropic ashing and that a horizontal ashing amount of the adhesive be controlled to 5 to 15 μm. An oxygen plasma moves also to under foreign substances by performing isotropic ashing and, therefore, the adhesive under the foreign substances is all removed. The exfoliation of the spacer can be prevented because the horizontal ashing amount of the adhesive be controlled to 5 to 15 μm.

In the present invention, it is preferred that in the wipe-off cleaning step using the organic solvent, it is preferred that the organic solvent be caused to infiltrate into a dustless cloth and that the outer surface side of the cover glass having a spacer be wiped off at least five times. As a result of this, the greater part of the foreign substances adhering to the outer surface side of the cover glass having a spacer can be removed and the foreign substances which remains by being divided by the wipe-off can be easily removed in the wet cleaning, which is a post-step.

In the present invention, it is preferred that in the step of APM cleaning, the chemical liquid temperature be 20 to 45° C. and that the application of ultrasonic vibrations of not less than 950 kHz be used in combination. It becomes possible to simultaneously satisfy both of a decrease in damage to the adhesive and cleanliness by ensuring that the chemical liquid temperature is 20 to 45° C., and cleanliness is further increased by the combined use of high-frequency ultrasonic vibrations of not less than 950 kHz. Thus, it is ensured that the present invention can further exhibit its effects.

In the present invention, it is preferred that the volume mixing ratio of $NH_4OH$, $H_2O_2$ and $H_2O$, which are components of the chemical liquid of the APM cleaning, be $1/20 \leq H_2O_2/H_2O \leq 1/3$ and $1/10 \leq NH_4OH/H_2O_2 \leq 1/3$. By ensuring this mixing ratio, it is possible to lower the etching rate of the silicon as the spacer compared to the glass, and as a result of this, it is possible to reduce an undercut of the spacer.

In the present invention, it is preferred that in the step of removing foreign substances by the pure-water ultrasonic cleaning, low-frequency vibrations of not more than 50 kHz be applied and that the pure water temperature be kept at 20 to 35° C. Low-frequency vibrations of not more than 50 kHz are especially effective in the removal of large foreign substances of about several tens of micrometers having strong adhesion, and the removal of the foreign substances which has been incapable of being removed by the cleaning with the APM liquid can be easily performed. By keeping the pure water temperature at 20 to 35° C., it becomes possible to simultaneously satisfy both of a decrease in damage to the adhesive and cleanliness. Furthermore, because pure water is used, a rinse step which is necessary after APM cleaning becomes unnecessary.

In the present invention, it is preferred that a step of warm-water pull-up drying step be provided after the secondary wet cleaning step and the temperature of a drying tank be kept at 20 to 35° C. An adhesive is apt to be dissolved in a solvent such as EPA (isopropyl alcohol) and hence a drying method using a solvent is undesirable. However, in the present invention, the dissolution of a solvent does not occur because warm-water drying is adopted. Furthermore, the water temperature is kept at 20 to 35° C., it is possible to simultaneously satisfy both of a decrease in damage to the adhesive and cleanliness.

As described above, according to the present invention, high cleaning performance is obtained because the wipe-off step with an organic solvent after ashing and the wet cleaning step which follows the wipe-off step are provided. Particularly, because an APM cleaning liquid is used, a zeta potential on the glass surface takes a large negative value and, therefore, the re-adhering of foreign substances seldom occurs.

BRIEF DESCRIPTION OF THE DRAWINGS

FIGS. 6A and 6B are sectional views of a cover glass which show the effect of the blending ratio of an APM cleaning liquid and the like;

DETAILED DESCRIPTION OF THE PREFERRED EMBODIMENTS

Hereinafter, a preferred embodiment of a method of cleaning a cover glass having a spacer related to the present invention will be described with reference to the accompanying drawings.

Figure 1:
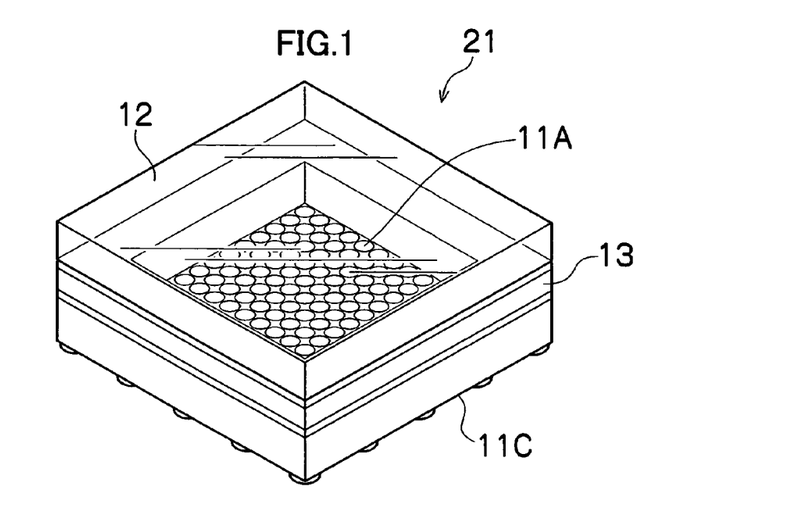
FIG. 1 is a perspective view of a solid image pickup device to which a method of cleaning a cover glass having a space related to the present invention is applied.
Figure 2:
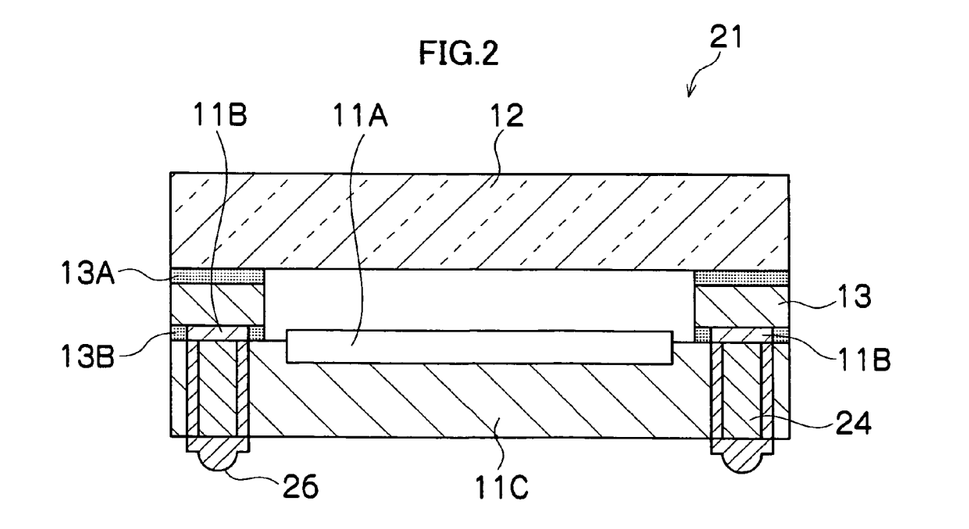
FIG. 2 is a partial sectional view of a solid image pickup device to which a method of cleaning a cover glass having a space related to the present invention is applied.

FIGS. 1 and 2 are, respectively, a perspective view of the appearance shape and of a partial sectional view of a solid image pickup device of chip size package (CSP) type, to which a method of cleaning a cover glass having a space related to the present invention is applied.

A solid image pickup device 21 is constituted by a rectangular solid image pickup element chip 11C, which is provided with a solid image pickup element 11A and multiple pads 11B, 11B . . . which are connection terminals to be electrically connected to the solid image pickup element 11A, a frame-shaped spacer 13 which is mounted on the solid image pickup element chip 11C so as to surround the solid image pickup element 11A, and a cover glass 12 which is mounted on this spacer 13 and seals the solid image pickup element 11A.

Incidentally, the image pickup element chip 11C is obtained by dividing a semiconductor substrate (a wafer), which will be described later. The spacer 13 is bonded to the cover glass 12 via an adhesive 13A and to the solid image pickup element chip 11C via an adhesive 13B.

A general semiconductor manufacturing process is applied to the manufacture of the solid image pickup element 11A. The solid image pickup element 11A is constituted by a photodiode which is a photo-detecting element formed on the wafer (the solid image pickup element chip 11C), a transfer electrode which transfers an excitation voltage to the outside, a light shielding film having an opening, an interlayer dielectric film, an inner lens formed in an upper part of the interlayer dielectric film, a color filter provided in an upper part of the inner lens via an intermediate layer, a microlens provided in an upper part of the color filter via an intermediate layer and the like.

Because the solid image pickup element 11A is constructed as described above, the light which becomes incident from the outside is condensed by the microlens and the inner lens and radiated on the photodiode, whereby the effective aperture rate is increased.

The pads 11B, 11B . . . are formed from an electrically conductive material, for example, on the solid image pickup element chip 11C by the thin film forming method. Also, the pad 11B and the solid image pickup element 11A are similarly interconnected by the thin film forming method.

Furthermore, a through interconnection 24 which pierces through the solid image pickup element chip 11C is provided, whereby a conducting state is ensured between the pad 11B and an external connection terminal 26.

It is general practice to use a single-crystal silicon wafer as the wafer which is divided into many solid image pickup element chips 11C.

The spacer 13 is formed from an inorganic material, for example, silicon. That is, a material having physical properties, such as the coefficient of thermal expansion, similar to those of the wafer (the solid image pickup element chip 11C) and the cover glass 12 is desirable as the material for the spacer 13. For this reason, silicon is best suited as the material for the spacer 13.

In order to prevent the breakdown of a photodiode of a CCD, transparent α-ray shielding glass is used in the cover glass 12.

Next, a method of cleaning a cover glass having a spacer related to the present invention will be described. Incidentally, for the convenience of description, the same reference numeral 12 refers to both the glass substrate as the cover glass and the cover glass having a spacer. The cover glass having a spacer may sometimes be simply called the cover glass 12.

FIG. 7C is, as already described, a sectional view of the cover glass having a spacer 12. FIGS. 3A to 3G are flowcharts of a method of cleaning a cover glass having a space related to the present invention and sectional views of the cover glass having a spacer 12 during the cleaning, which show an enlarged part corresponding to each solid image pickup element chip 11A of the cover glass having a spacer 12 shown in FIG. 7C. FIG. 4 is a table which shows the conditions for dry cleaning, primary wet cleaning and secondary wet cleaning.

Figure 3A:
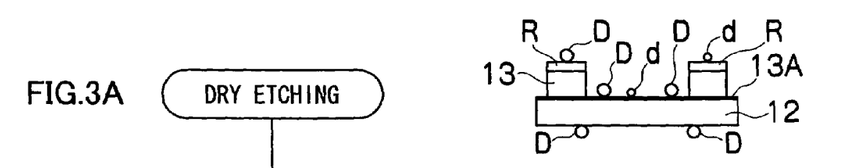
FIGS. 3A to 3G are flowcharts of a method of cleaning a cover glass having a space related to which the present invention is applied and sectional views of the cover glass during the cleaning.
Figure 4:
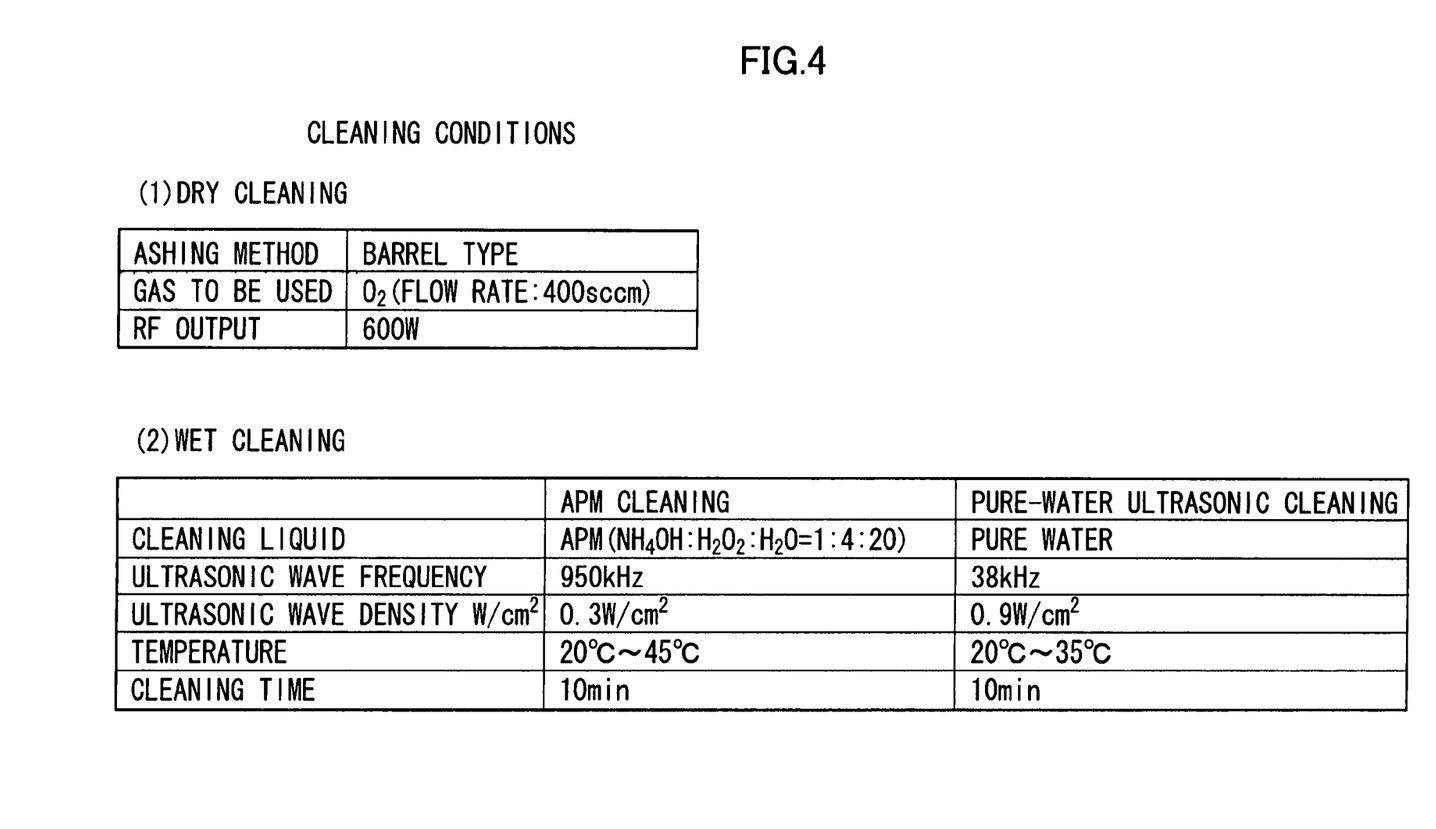
FIG. 4 is a table which shows the conditions for dry cleaning, primary wet cleaning and secondary wet cleaning.

In FIG. 3A, the dry etching of the spacer substrate 13 (which is referred to by the same reference numeral as the spacer for the benefit of description) is performed. As an apparatus for this dry etching and conditions for the dry etching, it is possible to adopt various known apparatus and conditions capable of being applied to the manufacture of semiconductor devices and the like. As a result of this, the spacer 13 can be formed on the cover glass 12. In the section of the cover glass 12 after dry etching, as shown in FIG. 3A, large foreign substances D, D . . . and small foreign substances d, d . . . are present in a mixed condition.

Subsequently, in FIG. 3B, dry cleaning (ashing) by an oxygen plasma is performed. This ashing is a step of removing the photoresist R on the spacer 13 and the adhesive 13A on the cover glass 12. Because the adhesive 13A on the cover glass 12 is difficult to remove in succeeding steps (the primary wet cleaning step and the secondary wet cleaning step), it is necessary that the adhesive 13A on the cover glass 12 be completely removed by this dry cleaning (ashing).

As shown in FIG. 4, an isotropic ashing method in which ashing proceeds in the two directions of vertical and horizontal directions by use of a barrel type ashing device is adopted as the ashing method of the present invention. The flow rate of oxygen is controlled to 400 sccm, and the output of a high-frequency power supply is set at 600 W.

Figure 5A:
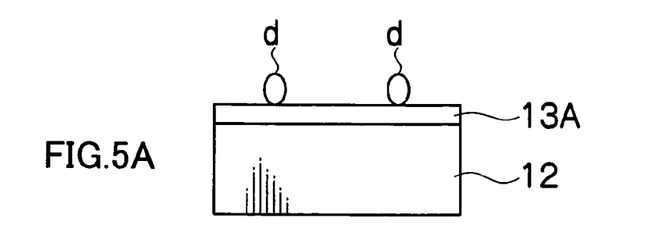
FIGS. 5A to 5E are flowcharts to explain the action of isotropic ashing.

Flowcharts to explain the action of isotropic ashing are shown in FIGS. 5A to 5E. FIG. 5A is an enlarged view of a portion of the spacer 13 where no pattern is formed in FIG. 7B. In FIG. 5A, what is present on the surface of the adhesive 13A is foreign substances d, d such as particles.

Figure 5B:
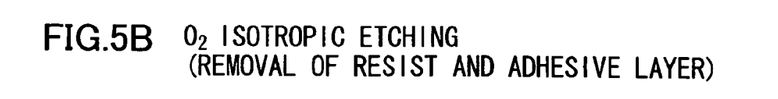
Figure 5C:
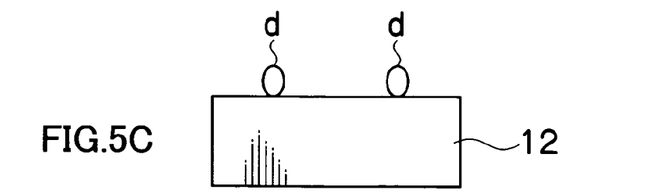
Figure 5D:
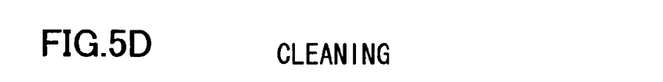
Figure 5E:
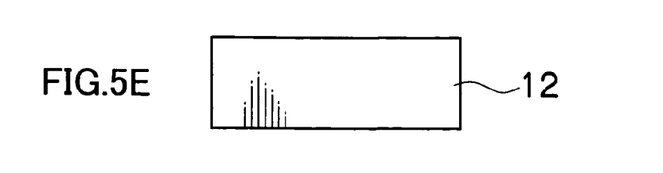

In FIG. 5B, oxygen plasma ashing is performed to remove the pattern of the photoresist R and the layer of the adhesive 13A. In this ashing, as described above, isotropic ashing is performed and, therefore, also the adhesive 13A under the foreign substances d, d is removed as shown in FIG. 5C, without the action of the foreign substances d, 4 as a mask during the ashing.

Figure 3B:
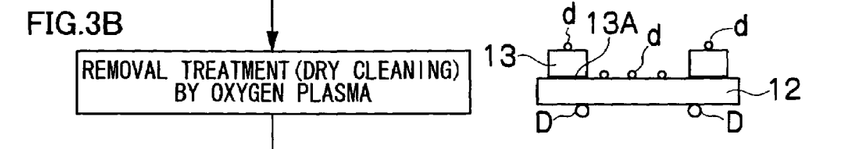

Virtue of such an action, as shown in FIG. 3B, also the photoresist R and adhesive 13A under the foreign substances D, d are removed. At this time, the horizontal ashing amount of the adhesive 13A is controlled to 5 to 15 μm.

If the horizontal ashing amount of the adhesive 13A is less than 5 μm, it is impossible to completely remove the layer of the adhesive 13A. If the horizontal ashing amount of the adhesive 13A exceeds 15 μm, the adhesion area of the spacer 13 decreases and the adhesive strength becomes insufficient, causing the exfoliation of the spacer.

In this ashing step, the pattern of the photoresist R and the layer of the exposed adhesive 13A are removed and the section of the cover glass 12 comes to a condition shown in FIG. 3B (the dry cleaning step).

Next, the surface of the cover glass 12 on the side where the spacer 13 is not formed (referred to as an outer surface) is wiped off with an organic solvent. Large foreign substances D, D, . . . as environmental foreign substances adhere also to the outer surface of this cover glass. An organic solvent (for example, alcohol) is caused to infiltrate into a dustless cloth, such as Bencot (trade name) and the outer surface side of the cover glass 12 is wiped off at least five times.

Figures 3C, 3D:
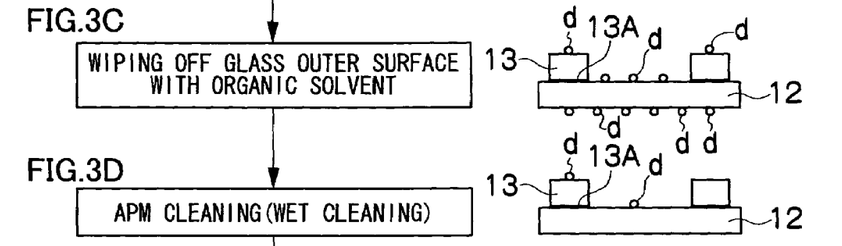

The frequency of wiping off is preferably not less than five times, because foreign substances D, D, . . . cannot be thoroughly wiped off if the frequency of wiping off is less than five times. As a result of this, the greater part of the large (several tens of micrometers or so) foreign substances D, D, . . . adhering to the outer surface side of the cover glass 12 are removed, and part of the foreign substances D, D, . . . are subdivided into small foreign substances d, d, . . . as shown in FIG. 3C. The small subdivided foreign substances d, d, . . . can be easily removed in the wet cleaning step, which is a succeeding step (wipe-off cleaning step).

Subsequently, in FIG. 3D, cleaning using an APM cleaning liquid (APM cleaning), which is a primary wet cleaning step, is performed. The purpose of this primary wet cleaning step is to cause dry etching residues, foreign substances ascribable to the environment and the like which were incapable of being removed in the preceding step (dry cleaning) to float up from the surface of the cover glass 12. That is, light etching of the surface of the cover glass 12 is performed by use of an APM cleaning liquid, whereby the bonding force between the foreign substances d, d, . . . and the glass is weakened to facilitate removal.

The APM (ammonia-hydrogen peroxide mixture) cleaning liquid is a cleaning liquid which is used in the Si wafer cleaning method (RCA cleaning) advocated by RCA Corporation, U.S.A., and in this liquid the volume mixing ratio of ammonia: hydrogen peroxide: water is set at a prescribed value. It is said that this cleaning method is excellent in the removal of organic stains and adhering particles.

An example of preferable cleaning conditions is shown in FIG. 4. That is, the volume mixing ratio of ammonia: hydrogen peroxide: water in the APM cleaning liquid is set at 1:4:20 and the liquid temperature is controlled to 20 to 45° C. The frequency of applied ultrasonic waves is 950 kHz and the density of ultrasonic waves is 0.3 W/cm$^2$. The cleaning time is 10 minutes.

If the temperature of the APM cleaning liquid is less than 20° C., the cleaning effect is low and etching residues and environmental foreign substances remain in large amounts. If the temperature of the APM cleaning liquid exceeds 45° C., damage occurs to the adhesive 13A and the adhesive force decreases.

As already described, one of the features of the present invention resides in that the volume mixing ratio of ammonia to hydrogen peroxide of the APM cleaning liquid is set at $1/10 \leq NH_4OH/H_2O_2 \leq 1/3$ (that is, ammonia: hydrogen peroxide=10 to 34:100) and that the volume mixing ratio of hydrogen peroxide to water of the APM cleaning liquid is set at $1/20 \leq H_2O_2/H_2O \leq 1/3$ (that is, hydrogen peroxide: water=5 to 34:100).

Although the volume mixing ratio of ammonia: hydrogen peroxide: water of an APM cleaning liquid in usual RCA cleaning, is set at 1:1 to 2:5 to 7, the above-described values are adopted in the present invention. By adopting this mixing ratio, it is possible to reduce the etching rate of silicon as the spacer 13 compared to the etching rate of glass and as a result of this, the undercut of the spacer 13 can be reduced. Details of this effect will be given later.

Incidentally, as already described, in the primary wet cleaning step, the effect of removing relatively small foreign substances d having a size of several micrometers is obtained by the combined use of high-frequency ultrasonic waves of 950 kHz. Also, by setting the temperature of the chemical liquid at low temperatures of 20 to 35° C., it is possible to simultaneously satisfy both of a decrease in damage to the adhesive and cleanliness.

In this primary wet cleaning step, as shown in FIG. 3D, foreign substances d, d, . . . are almost completely removed and small foreign substances d remain in very small amounts (the primary wet cleaning step).

Subsequently, in FIG. 3E, pure-water ultrasonic cleaning is performed. This pure-water ultrasonic cleaning is a step of removing small foreign substances d which could not be removed in the cleaning by use of an APM cleaning liquid.

An example of preferable cleaning conditions is shown in FIG. 4. That is, pure water (ultrapure water) at 20 to 35° C. is used as the cleaning liquid. If the temperature of the pure water is less than 20° C., the cleaning effect is low and foreign substances remain. If the temperature of the pure water exceeds 35° C., damage to the adhesive 13A becomes great and the adhesive force decreases. It is preferred that the pure water temperature be 20 to 35° C. in order to simultaneously satisfy both of a decrease in damage to the adhesive 13A and cleanliness.

The frequency of ultrasonic waves is 38 kHz and the density of ultrasonic waves is 0.9 W/cm$^2$. The cleaning time is 10 minutes. Such low-frequency ultrasonic waves are effective also in removing large foreign substances D having high adhesive force. For this purpose, it is preferred that ultrasonic waves have low frequencies of not more than 50 kHz. Also, the use of pure water (ultrapure water) makes unnecessary a rinse step which might follow the wet cleaning step.

By adding this step, it becomes easy to perform the removal of small foreign substances d which could not be removed in the cleaning by use of an APM cleaning liquid (the secondary wet cleaning step).

Subsequently, in FIG. 3F, pull-up drying in warm pure-water drying is performed. It is preferred that the temperature of the pure water at this time be set at 20 to 35° C., in order to simultaneously satisfy both of a decrease in damage to the adhesive 13A and drying characteristics (the warm-water pull-up drying step). The condition after the finish of drying is shown in FIG. 3G. In this condition, various kinds of foreign substances D, D . . . d, d, . . . have been completely removed.

Next, a method of cleaning a cover glass related to the present invention will be described. Particularly, a description will be given of the effect of the volume mixing ratio of ammonia: hydrogen peroxide: water of an APM cleaning liquid and existence or nonexistence of pure-water ultrasonic cleaning (FIG. 3E) after the APM cleaning on the removability of foreign substances D, D . . . d, d, . . . and the adhesive strength of the spacer 13.

In the present invention, the ashing treatment by an oxygen plasma as the dry cleaning step is performed as isotropic ashing, and not as anisotropic ashing. For this reason, foreign substances D, D . . . d, d, . . . do not act as a mask during ashing, and the pattern of the photoresist R and adhesive 13A under the foreign substances D, D . . . d, d, . . . are also ashed and removed.

Next, in the wipe-off cleaning step, the outer surface side of the cover glass 12 where the spacer 13 is not formed is wiped off five times or more with a dustless cloth which is impregnated with an organic solvent. As a result of this, almost all large foreign substances D, D . . . adhering to the outer surface of the cover glass 12 are removed, and also foreign substances D which have not been removed, are subdivided and can be easily removed in the next wet cleaning step.

Figure 6A:
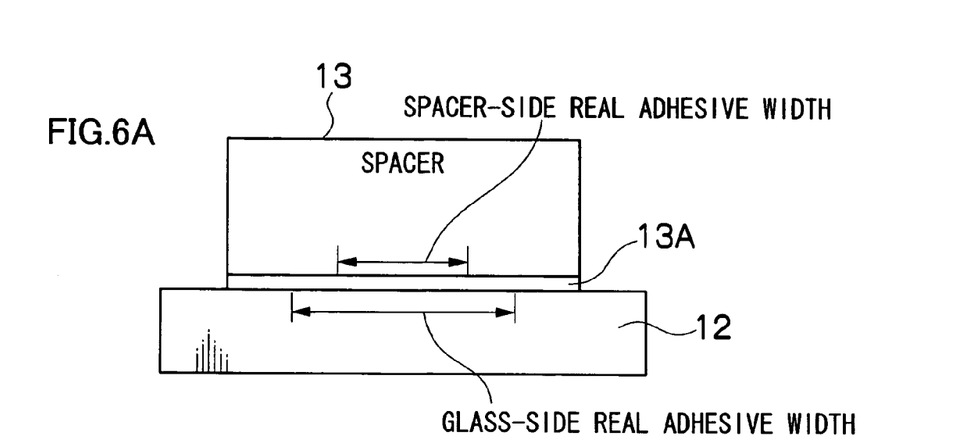
Figure 6B:
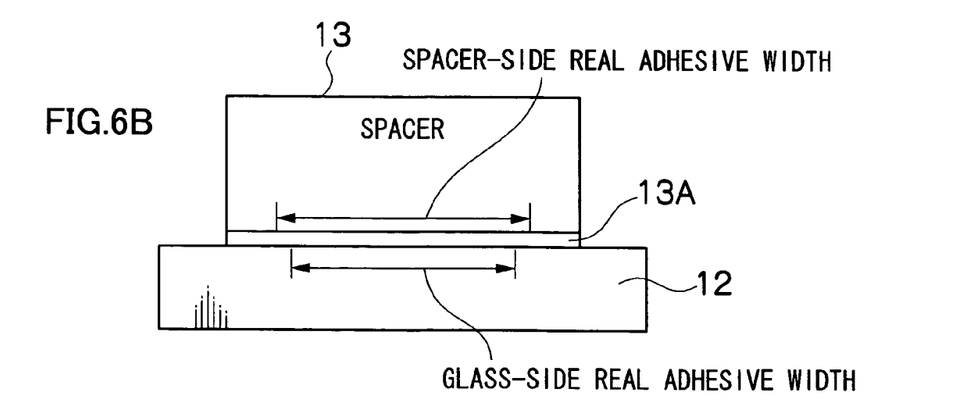

Next, a description will be given of the action of the APM cleaning of the primary wet cleaning step and of the pure-water ultrasonic cleaning of the secondary wet cleaning step. FIGS. 6A and 6B are enlarged views of the cover glass 12 shown in FIG. 3G after the finish of the drying step, and correspond to FIG. 7C described above.

Figure 3E:
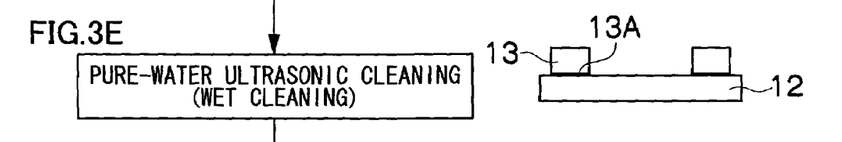
Figure 3F:
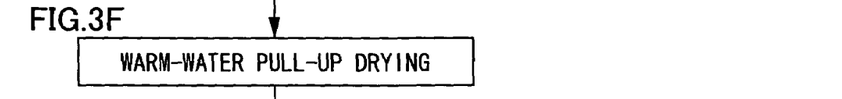
Figure 3G:
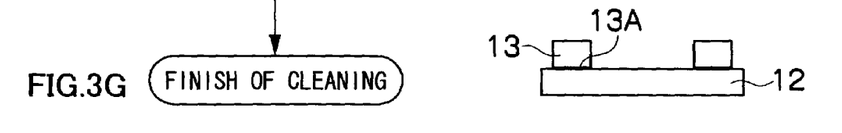

FIG. 6A shows the cover glass 12 obtained by using an APM cleaning liquid in which the volume mixing ratio of ammonia: hydrogen peroxide: water is 1:1:5 (therefore, $NH_4OH/H_2O_2 > 1/3$) and omitting the pure-water ultrasonic cleaning after the APM cleaning (FIG. 3E).

FIG. 6B shows the cover glass 12 obtained by using an APM cleaning liquid in which the volume mixing ratio of ammonia: hydrogen peroxide: water is 1:4:20 (therefore, $NH_4OH/H_2O_2 \leq 1/3$) and performing the pure-water ultrasonic cleaning after the APM cleaning (FIG. 3E) according to the flowchart of FIGS. 3A to 3G and under the conditions shown in FIG. 4.

In FIG. 6A, the etching rate of the spacer 13 (silicon) with the APM cleaning liquid is high and, therefore, the amount of an undercut of the spacer 13 is also large. Although the etching rate of the cover glass 12 with the APM cleaning liquid is not as high as with the silicon, a prescribed etching amount exists and a prescribed amount of an undercut occurs in the cover glass 12.

As a result of this, the spacer-side real adhesive width and the glass-side real adhesive width have sizes as indicated by the arrows in FIG. 6A. Therefore, the adhesion area between the spacer 13 and the adhesive 13A decreases due to this undercut of the spacer 13 and a chipped portion due to the exfoliation of the spacer 13 is apt to be formed.

Incidentally, because the etching amount (etching rate ×treatment time) of the cover glass 12 with the APM cleaning liquid reaches a prescribed amount, the foreign substances d, d, . . . are removed (lifted off) from the surface of the cover glass 12.

In FIG. 6B, the etching rate of the spacer 13 (silicon) with the APM cleaning liquid decreases and the amount of an undercut of the spacer 13 also decreases. Although the etching rate of the cover glass 12 with the APM liquid is small compared to that obtained under the conditions of FIG. 6A, a long treatment time is adopted in consideration of this and the etching amount is almost the same as under the conditions of FIG. 6A. Therefore, the amount of an undercut of the cover glass 12 is almost the same conditions as the conditions of FIG. 6A.

As a result of this, the spacer-side real adhesive width and the glass-side real adhesive width have sizes as indicated by the arrows in FIG. 6B and are larger than those under the conditions of FIG. 6A. Therefore, the case of FIG. 6B is free from the problem that the adhesion area between the spacer 13 and the adhesive 13A decreases due to this undercut of the spacer 13 and that a chipped portion due to the exfoliation of the spacer 13 is apt to be formed. It is important to be able to ensure that the real adhesive width between the spacer 13 and the adhesive 13A is larger than the glass-side real adhesive width.

Because the temperature of the APM cleaning liquid is set at 20 to 45° C., damage to the adhesive 13A is reduced, with the cleaning effect maintained. For this reason, a decrease in the peel strength of the spacer 13 does not occur in addition to the keeping of the real adhesive width.

Incidentally, the etching amount of the cover glass 12 with the APM cleaning liquid is the same as that under the conditions of FIG. 6A, the effect on the removal (lifting off) of the foreign substances d, d, . . . from the surface of the cover glass 12 has also the same level.

Furthermore, under the conditions of FIG. 6B, the introduction of the pure-water ultrasonic cleaning (FIG. 3E) after the APM cleaning results in an improvement of the removal (lifting off) of the foreign substances d, d, . . . from the surface of the cover glass 12.

Also in this case, because the temperature of pure water is set at 20 to 35° C., damage to the adhesive 13A is reduced, with the cleaning effect maintained. For this reason, a decrease in the peel strength of the spacer 13 does not occur.

Incidentally, under the conditions of FIG. 6B, the undercut of the cover glass 12 is the same as that under the conditions of FIG. 6A. However, by reducing the etching amount of the cover glass 12 with the APM cleaning liquid, it is also possible to reduce the amount of the undercut of the cover glass 12 from the level under the conditions of 6A. As a result of this, the adhesion area between the cover glass 12 and the adhesive 13A does not decrease. Therefore, the problem that a chipped portion due to the exfoliation of the spacer 13 is apt to be formed does not occur.

Incidentally, in this case, because the etching rate of the cover glass 12 with the APM cleaning liquid is lower than under the conditions of FIG. 6A, the level of the effect of the removal (lifting off) of the foreign substances d, d, . . . from the surface of the cover glass 12 also decreases. However, the introduction of the pure-water cleaning (FIG. 3E) after the APM cleaning enables the level of the effect of the removal (lifting off) of the foreign substances d, d, . . . from the surface of the cover glass 12 to be made almost the same as under the conditions 6A.

Under the above-described conditions of FIG. 6B (the flowchart of FIGS. 3A to 3G and the conditions of FIG. 4), it is possible to simultaneously satisfy both of the keeping the cleaning performance and the keeping the adhesive strength of the spacer 13.

As described above, according to a method of cleaning a cover glass having a spacer of the present invention, ashing treatment as the dry cleaning step is performed by isotropic ashing. For this reason, foreign substances D, D . . . , d, d, . . . do not act as a mask during ashing and the pattern of the photoresist R and adhesive 13A under the foreign substances D, D . . . , d, d, . . . are also ashed and removed.

The wipe-off cleaning step is provided and the outer surface side of the cover glass 12 where the spacer 13 is not formed is wiped off five times or more with a dustless cloth impregnated with an organic solvent. For this reason, almost all large foreign substances D, D . . . adhering to the outer surface of the cover glass 12 are removed, and also foreign substances D, which have not been removed, are subdivided and can be easily removed in the next wet cleaning step.

Subsequently, because the APM cleaning is performed in the primary wet cleaning step, foreign substances d, d . . . are removed (lifted off) from the surface of the cover glass 12. Furthermore, because the secondary cleaning step, which involves cleaning the cover glass 12 with pure water to which ultrasonic waves are applied, is performed after the APM cleaning, the foreign substances d, d . . . which have not been removed in the APM cleaning are removed from the surface of the cover glass 12.

According to a method of cleaning a cover glass having a space of the present invention, the advantage that the removal of needle-like protrusions on side walls of the spacer 13 formed during dry etching becomes easy is also obtained. As a result of this, the shape of the side walls of the space 13 is improved and the effect of the prevention of dust generation from the spacer 13 is also obtained.

An embodiment of a method of cleaning a cover glass having a space related to the present invention was described above. However, the present invention is not limited to the above-described embodiment and it is possible to adopt various embodiments.

For example, in the above-described embodiment, the volume mixing ratio of ammonia:hydrogen peroxide:water is 1:4:20. However, a prescribed effect can be obtained even when other mixing ratios are adopted.

That is, the undercut of the spacer 13 can be reduced by setting the volume mixing ratio of ammonia to hydrogen peroxide of the APM cleaning liquid at $1/10 \leqq NH_4OH/H_2O_2 \leqq 1/3$ and setting the volume mixing ratio of hydrogen peroxide to water of the APM cleaning liquid at $1/20 \leqq H_2O_2/H_2O \leqq 1/3$.

The conditions for the application of ultrasonic waves are not limited to the values shown in FIG. 4, and other various conditions (frequency, density of ultrasonic waves, cleaning time and the like) can be adopted.

What is claimed is:

1. A method of cleaning a cover glass having a spacer which is to be incorporated in a solid image pickup device, comprising:

performing a dry cleaning step after dry etching, the dry cleaning step being a step in which an etching mask on the spacer after the dry etching and an adhesive exposed to the glass substrate are removed by performing ashing by an oxygen plasma;

performing a wipe-off cleaning step after the dry cleaning step, the wipe-off cleaning step being a step in which foreign substances adhering to an outer surface side of the cover glass having a spacer where no spacer is formed is removed by being wiped off by use of an organic solvent;

performing a primary wet cleaning step after the wipe-off cleaning step, the primary wet cleaning step being a step of APM cleaning in which dry etching residues and environmental foreign substances which cannot be removed by the ashing by an oxygen plasma are caused to float up from the glass substrate by use of an APM cleaning liquid; and performing a secondary wet cleaning step after the primary wet cleaning step, the secondary wet cleaning step being a step of removing foreign substances by pure-water ultrasonic cleaning, wherein the cover glass having a spacer is fabricated by a manufacturing process including the steps of:

bonding a spacer substrate to a glass substrate with an adhesive;

applying a photoresist to the spacer substrate;

exposing and developing the photoresist by use of a photomask and forming an etching mask corresponding to the spacer on the spacer substrate; and forming a spacer on the glass substrate by the dry etching the spacer substrate.

2. The method of cleaning a cover glass having a spacer according to claim 1,
wherein the ashing by an oxygen plasma is isotropic ashing and a horizontal ashing amount of the adhesive is controlled to 5 to 15 μm.

3. The method of cleaning a cover glass having a spacer according to claim 1,
wherein in the wipe-off cleaning step using the organic solvent, the organic solvent is caused to infiltrate into a dustless cloth and the outer surface side of the cover glass having a spacer is wiped off at least five times.

4. The method of cleaning a cover glass having a spacer according to claim 1,
wherein in the step of APM cleaning, the chemical liquid temperature is 20 to 45° C. and the application of ultrasonic vibrations of not less than 950 KHz is used in combination.

5. The method of cleaning a cover glass having a spacer according to claim 1,
wherein the volume mixing ratio of $NH_4OH$, $H_2O_2$ and $H_2O$, which are components of the chemical liquid of the APM cleaning, is $1/20 \leqq H_2O_2/H_2O \leqq 1/3$ and $1/10 \leqq NH_4OH/H_2O_2 \leqq 1/3$.

6. The method of cleaning a cover glass having a spacer according to claim 1,
wherein in the step of removing foreign substances by the pure-water ultrasonic cleaning, low-frequency vibrations of not more than 50 KHz are applied and the pure water temperature is kept at 20 to 35° C.

7. The method of cleaning a cover glass having a spacer according to claim 1,
wherein a step of warm-water pull-up drying step is provided after the secondary wet cleaning step and the temperature of a drying tank is kept at 20 to 35° C.

* * * * *